United States Patent [19]

Valdettaro

[11] Patent Number: 4,633,206

[45] Date of Patent: Dec. 30, 1986

[54] EXPANDED DIAL ARRANGEMENT FOR 56 CHANNEL UHF TUNER

[75] Inventor: Alarico A. Valdettaro, Bloomington, Ind.

[73] Assignee: Sarkes Tarzian Licensing Laboratory, Bloomington, Ind.

[21] Appl. No.: 748,239

[22] Filed: Jun. 24, 1985

[51] Int. Cl.$^4$ ............................................... H03J 5/06
[52] U.S. Cl. .................................... 334/47; 74/10.41; 74/10.54; 334/55; 334/86; 116/245
[58] Field of Search ....................... 334/47, 86, 88, 49, 334/50, 51, 55; 74/10.41, 10.54; 455/179; 358/191.1, 192.1; 116/241, 245

[56] References Cited

U.S. PATENT DOCUMENTS 4,056,796 11/1977 Valdettaro ........................ 334/88 X Primary Examiner—Paul Gensler
Attorney, Agent, or Firm—Mason, Kolehmainen, Rathburn & Wyss

[57] ABSTRACT

The channel selector shaft of a 70 channel mechanically detented UHF tuner is provided with mechanical stops which prevent the shaft from moving above UHF channel No. 69 so that the upper twenty-four UHF channels are unused. Also, a dial driving arrangement is provided for driving an expanded UHF dial having only 56 channel indicia so that the 56 channel indicia cover substantially the same area on the dial as the 70 channel indicia of prior art arrangements.

5 Claims, 8 Drawing Figures

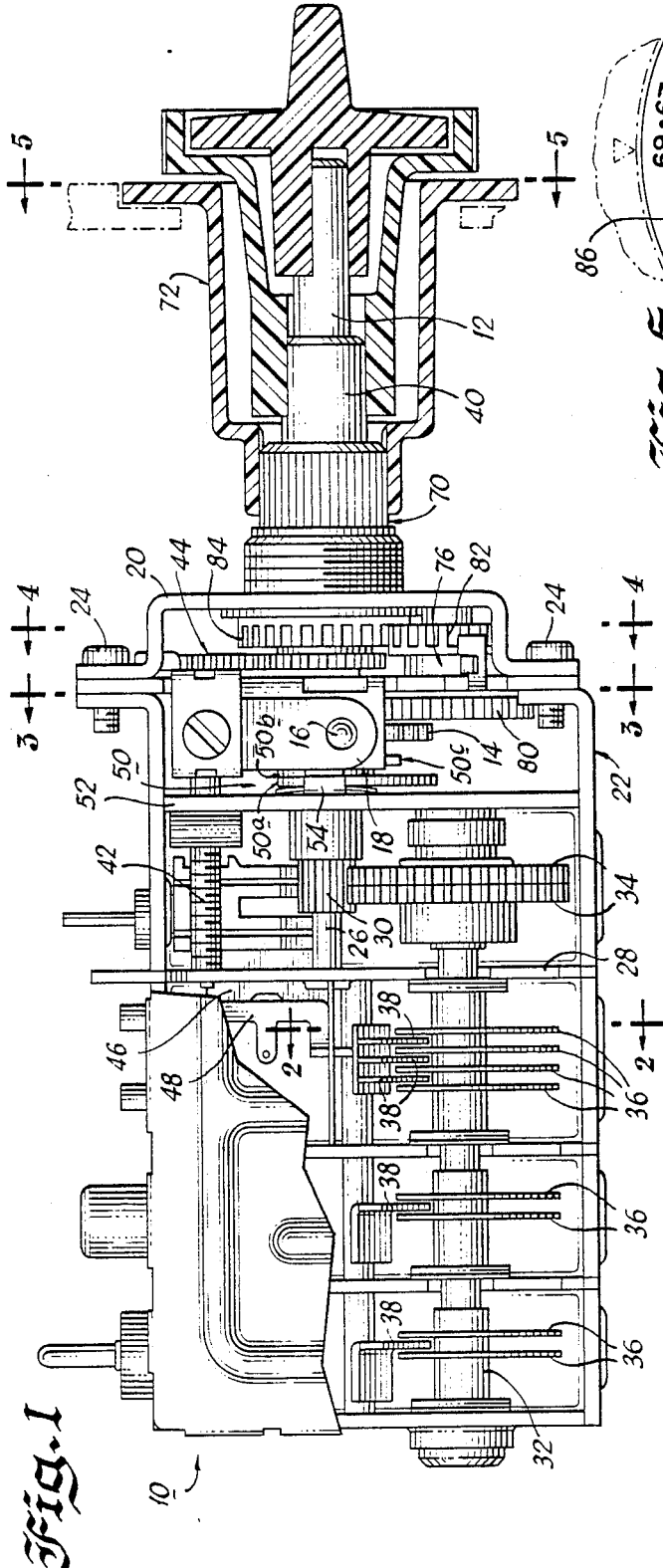
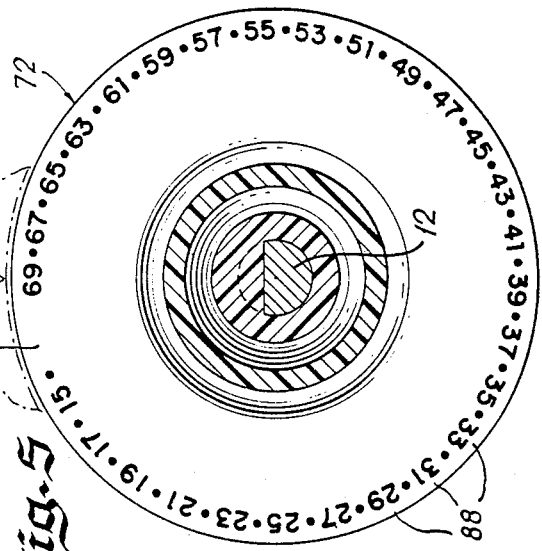
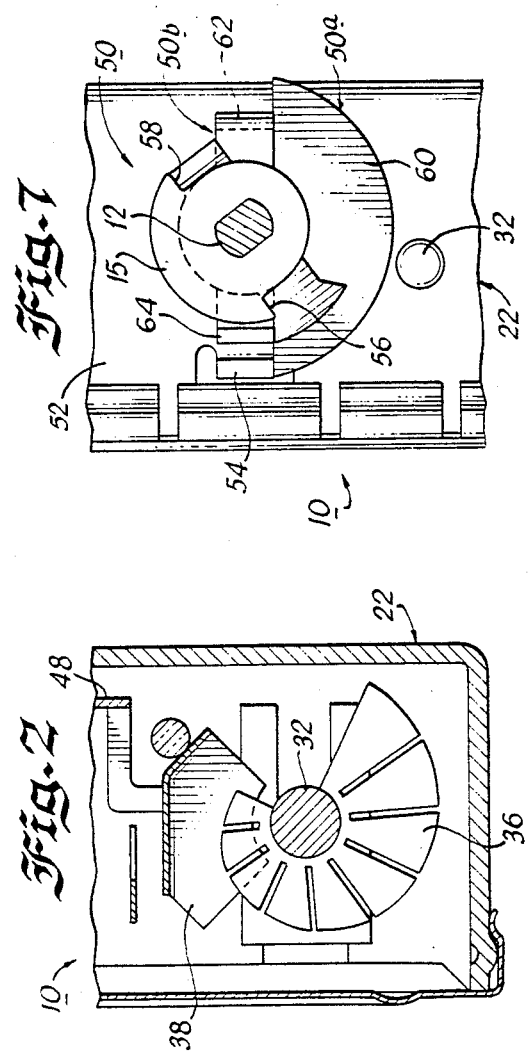

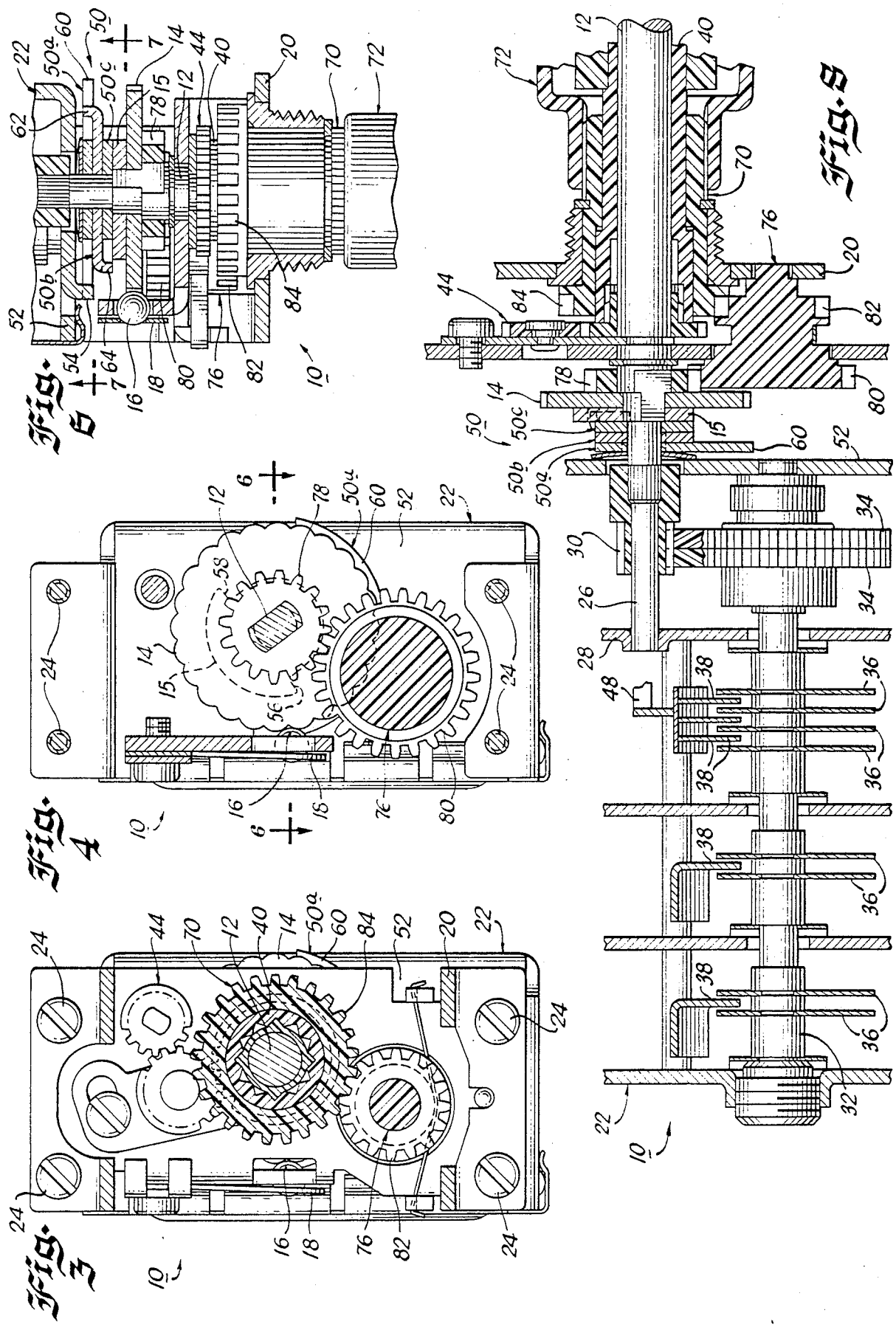

EXPANDED DIAL ARRANGEMENT FOR 56 CHANNEL UHF TUNER

The present invention relates to mechanically detented UHF television tuners, and, more particularly, to UHF tuners of this type which are provided with a direct reading disk dial.

Present day mechanically detented UHF tuners with direct reading disk dials have stringent requirements placed upon them by the FCC. Three of their performance characteristics i.e., noise figure, tuning accuracy and radiation are pushed to the limit by the regulations established by the FCC.

In August of 1982 the FCC permitted the range of UHF tuners to be reduced from 70 UHF channels, i.e., UHF channels 14 to 83, to 56 UHF channels i.e., UHF channels 14 to 69. At that time, after the production of tens of millions of UHF tuners covering 70 channels, the design of the 70 channel UHF tuner was well developed and debugged, and tailored to meet the stringent requirements of the FCC, which are particularly onerous at the high frequency end of the UHF band. These mechanically detented 70 channel UHF tuners have detent positions every 15° so that each turn of the channel selector shaft covers 24 channels and the entire band of 70 channels is covered in slightly less than 3 turns.

While it would be possible to completely redesign an existing 70 channel UHF tuner so that the tuning condensers and resonant lines of the RF, mixer and oscillator stages of the tuner cover only 56 channels spread over the same range of movement of the channel selector shaft, i.e., slightly less than 3 turns, such redesign would be time consuming and expensive. Also, the stringent requirements of the FCC regarding noise figure, tuning accuracy, etc., would not be eliminated since the problems of adjustment of tuning accuracy at the high frequency end of the band would still remain.

In accordance with the present invention, a 56 channel UHF tuner is provided in which the above discussed disadvantages of prior art arrangements are eliminated in a simple and inexpensive manner. This is accomplished by retaining the accurately designed variable tuning condensers and resonant line structure of the prior art 70 channel mechanically detented UHF tuners and providing a mechanical stop which prevents the channel selector shaft from moving above channel 69 so that the upper 24 UHF channels are unused. In addition, an arrangement is provided for driving an expanded UHF dial having only 56 channel indicia so that the 56 channel indicia over substantially the same area on the dial as the 70 channel indicia of the prior art arrangements. Furthermore, this expanded dial drive arrangement of the present invention utilizes the same gear to gear center distances as the prior art 70 channel dial drive arrangements, when the gears are engaged on their pitch diameters, so that the expanded dial is driven smoothly from the UHF channel selector shaft to provide the expanded 56 channel indications.

The invention both as to its organization and method of operation, together with further objects and advantages thereof, will best be understood by reference to the following specification taken in connection with the accompanying drawings, in which:

FIG. 1 is a top plan view of a mechanically detented UHF tuner embodying the present invention;

FIG. 2 is a fragmentary sectional view taken along the line 2—2 of FIG. 1 and showing the tuning condenser plates in the UHF channel No. 69 position;

FIG. 3 is a sectional view taken along the line 3—3 of FIG. 1;

FIG. 4 is a sectional view taken along the line 4—4 of FIG. 1;

FIG. 5 is a sectional view taken along the line 5—5 of FIG. 1;

FIG. 6 is a sectional view taken along the line 6—6 of FIG. 4;

FIG. 7 is a sectional view taken along the line 7—7 of FIG. 6; and

FIG. 8 is a diagrammatic view of the expanded dial drive arrangement provided in the tuner of FIG. 1.

Referring now to the drawings, the UHF tuner of the present invention, which is illustrated generally at 10, includes a channel selector shaft 12 which is mechanically detented by an index wheel 14 which has 24 indentations in the periphery thereof, the index wheel 14 being detented by means of a ball 16 which is urged into the periphery of the index wheel 14 by means of the leaf spring 18. The central portion of the selector shaft 12 is journalled in a bracket 20 which is secured to the main housing 22 of the tuner 10 by means of the screws 24, and the rear end 26 of the selector shaft 12 is journalled in an intermediate partition 28 in the housing 22. A gear 30 on the inner end of the shaft 12 drives the rotor shaft 32 of the tuner 10 through the antibacklash gears 34.

The rotor plates 36 of the tuning condensers for the local oscillator, mixer and RF stages of the tuner 10 are carried by the rotor shaft 32 and cooperate with fixed stator plates 38 provided in each of these stages of the tuner 10 to select the desired UHF channel. The gears 30, 34 provide an appropriate step-down ratio so that rotation of the channel selector shaft from one detented position to the next rotates the rotor shaft 32 by 3.5° per channel. A fine tuning shaft 40 is mounted on the channel selector shaft 12 and drives a fine tuning lead screw 42 through the gearing 44, the lead screw 42 driving a variable fine tuning element 46 associated with the local oscillator resonant line 48.

The UHF tuner 10 described thus far is similar to conventional 70 channel mechanically detented UHF tuners and the tuning capacitors 36, 38 are capable of selecting any one of the 70 UHF channels. However, at the high end of the UHF band considerable difficulty is experienced in aligning the tuner to the accuracy required by the FCC due to the small capacities available to work with and the large percentage of stray capacities of uncontrollable nature which are present in each of the local oscillator, mixer and RF stages of the tuner 10.

In accordance with the present invention, a mechanical stop arrangement is provided for the channel selector shaft 12 so that it cannot be moved beyond the channel 69 position even though the tuning condensers 36, 38 are capable of receiving UHF channels 70 to 83. By limiting movement of the channel selector shaft 12 to UHF channel No. 69 as the uppermost channel which can be received, the position of the tuning condenser plates 36, 38 at this channel is such that a substantial overlap between the condenser plates is provided, as shown in FIG. 2, so that the minimum capacity which is available for tuning at channel 69 is substantially greater than the minimum capacity position of a conventional 70 channel UHF tuner. Thus, by limiting movement of the channel selector shaft 12 to the UHF channel No. 69 position, several advantages are provided in addition to the elimination of the requirement of meeting FCC specifications for unused UHF channels 70-83. As shown in FIG. 2, the capacity of the condensers 36, 38 at channel 69 is considerably larger thus facilitating alignment by means of the conventional segmented condenser blades 36. Also, the condenser rotor blades 36 are well away from the upper frequency end region where the rotor begins to reenter the stator causing nonlinearity of capacity change and gyrations in the resonant frequency. Furthermore, components such as transistors and diodes which are broader in tolerance range and hence are less expensive, may be employed in the mixer and AFC portions of the the UHF tuner 10 when the tuning range is limited to UHF channel No. 69, whereas these same components could not be used in a conventional 70 channel UHF tuner and still meet the stringent requirements on tuning accuracy at the highest frequency channels.

The above described mechanical stop arrangement for limiting movement of the channel selector shaft 12 comprises a series of lost motion links or accumulating washers 50 which are positioned on the channel selector shaft 12 between the index wheel 14 and a partition 52 of the housing 22, the links 50 being movable between a fixed stop 54 provided on the partition 52 and the shoulders 56 and 58 formed in a plate 15 secured to the detent wheel 14. The rearmost link 50a is provided with an outwardly extending lug portion 60 positioned in line with the ear 54 on the partition 52 and the intermediate link 50b is provided with right angle end portions 62 and 64 which interconnect the links 50a, 50b and 50c so as to permit rotation of the channel selector shaft 12 through only 825° corresponding to 55 detent intervals with 15° between each detent point.

In a conventional 70 channel UHF tuner a dial indicator shaft 70 is rotatably mounted on the fine tuning shaft 40 and is driven from the station selector shaft 12 through gearing having a step-down ratio such that a UHF disk dial 72 connected to the dial indicator shaft 70 is rotated approximately 330° when the station selector shaft 12 is rotated slightly less than 3 revolutions to cover the entire UHF televison band from channel 14 to channel 83. In such a tuner, if rotation of the channel selector shaft 12 is limited to channels 14 to 69, inclusive, the disk dial 72 would be rotated a substantially smaller amount and a considerable portion of the dial 72 would be blank. In accordance with an important aspect of the present invention an expanded dial drive arrangement is provided for the dial indicator shaft 72 so that when rotation of the channel selector shaft 12 is limited to channels 14 to 69, inclusive, the 56 UHF channel indications on the dial 72 extend over substantially the same area of the dial as a conventional 70 channel UHF tuner. As a result, larger channel indicia may be used on the dial 72 and an objectionable gap in the channel numbers is avoided. To this end, a jack shaft 76 (FIG. 8) is provided which is offset from and parallel to the channel selector shaft 12 and the jack shaft 76 is interconnected with the channel selector shaft 12 through a gear 78 on the channel selector shaft and a gear 80 on one end of the jack shaft 76. The jack shaft 76 is also connected to the UHF dial indicator shaft 70 through the gear 82 on the other end of the jack shaft 76 and the gear 84 on the dial indicator shaft 70. Preferably the gears 80 and 82 are formed integrally with the jack shaft 76 and the gear 84 is formed integrally with the dial indicator shaft 70.

The gears 78, 80 and 82, 84 have an overall gear reduction ratio of 1:0.4096 (approximately 2.44:1) so that the dial indicator shaft 70 rotates approximately 338° in response to rotation of the channel selector shaft 12 through 825° to cover channels 14 to 69, inclusive. Accordingly, the indicia for these channels occupy substantially the entire area of the dial 72, as shown in FIG. 5, except for a small 30° area 86 between channels 14 and 69. Also, the UHF channel indicia 88 on the dial 72 are made as large as possible to provide UHF station indications which are compatible with that in the VHF television band. The gap 86 is desirable to provide an indication to the user that the mechanical stops adjacent channels 14 and 69 have been reached so as to prevent the user from attempting to go directly from, for example, channel 69 to channel 14, thereby overloading the mechanical stop system of the tuner.

In accordance with an important aspect of the invention, the gear sets 78, 80 and 82, 84 both have the same gear reduction ratio of 1:0.64 i.e. the gears 78 and 82 have 16 teeth and the gears 80 and 84 have 25 teeth. By providing identical gear reduction pairs the overall dimensions for the expanded dial gear train is minimized so as to permit this expanded dial drive arrangement to be incorporated in existing 70 channel UHF tuners without modifying the mechanical dimensions of the tuner.

While there has been illustrated a single embodiment of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. A UHF tuner having a continuously variable main tuning shaft rotation of which is effectively selectively to receive 70 channels in the UHF television band, a station selector shaft, detent means for establishing 24 detented UHF channel positions of said selector shaft for each revolution thereof, first gear means interconnecting said selector shaft and said main tuning shaft, stop means for limiting rotation of said selector shaft to 56 detented channel positions beginning at the lowest frequency UHF channel in said UHF band, a UHF dial indicator shaft concentric with said station selector shaft and carrying a UHF dial having channel indications corresponding to said 56 UHF channels, and second gear means interconnecting said station selector shaft and said UHF dial indicator shaft, said second gear means providing a gear reduction ratio between said station selector shaft and said dial indicator shaft of approximately 2:44 to 1 so that said 56 UHF channel indications on said UHF dial extend over substantially one complete revolution of said UHF dial.

2. The UHF tuner of claim 1, wherein said 56 UHF channel indications extend over approximately 330 degrees of said UHF dial.

3. The UHF tuner of claim 1 wherein said second gear means comprises a jack shaft offset from and parallel to said station selector shaft, a first gear secured to said selector shaft and in engagement with a second gear on said jack shaft, and third gear on said jack shaft and in engagement with a fourth gear on said UHF dial indicator shaft.

4. The UHF tuner of claim 3, wherein said first and second gears have the same step-down ratio as said third and fourth gears.

5. The UHF tuner of claim 4, wherein said step down ratio is 16:25.

* * * * *